United States Patent
Hamade et al.

(10) Patent No.: US 9,798,236 B2
(45) Date of Patent: Oct. 24, 2017

(54) METHOD FOR FORMING PATTERN HAVING HOLLOW STRUCTURE

(71) Applicant: CANON KABUSHIKI KAISHA, Tokyo (JP)

(72) Inventors: Yohei Hamade, Tokyo (JP); Shoji Shiba, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/824,527

(22) Filed: Aug. 12, 2015

(65) Prior Publication Data

US 2016/0054655 A1 Feb. 25, 2016

(30) Foreign Application Priority Data

Aug. 22, 2014 (JP) ................. 2014-169145

(51) Int. Cl.
    G03F 7/09 (2006.01)
    G03F 7/00 (2006.01)
    G03F 7/095 (2006.01)

(52) U.S. Cl.
    CPC ............ G03F 7/091 (2013.01); G03F 7/0035 (2013.01); G03F 7/095 (2013.01)

(58) Field of Classification Search
    CPC ........................................................ G03F 7/26
    See application file for complete search history.

(56) References Cited

U.S. PATENT DOCUMENTS

| 7,763,883 | B2 | 7/2010 | Kato | |
| 2005/0037281 | A1* | 2/2005 | Sato | .......... G03F 7/095 |
| | | | | 430/270.1 |
| 2014/0087619 | A1* | 3/2014 | Seri | .......... G03F 7/027 |
| | | | | 445/24 |

FOREIGN PATENT DOCUMENTS

| JP | 2008-229947 A | 10/2008 |
| WO | 2011124898 A1 | 10/2011 |

OTHER PUBLICATIONS

Huang, et al., "Construction of Nontoxic Polymeric UV-Absorber with Great Resistance to UV-Photoaging", Scientific Reports, 6:25508, DOI: 10.1038/srep25508, pp. 1-12 (see p. 1 & Figure 1), May 3, 2016.

* cited by examiner

*Primary Examiner* — Kathleen Duda
(74) *Attorney, Agent, or Firm* — Canon USA, Inc. I.P. Division

(57) ABSTRACT

In at least one embodiment of a method for forming a pattern having a hollow structure, a light-absorbing layer capable of absorbing light is formed on a surface of a photosensitive resin film. Subsequently, a substrate having a protrusion and the photosensitive resin film are bonded together so that the protrusion and the light-absorbing layer come into contact with each other. Then, the photosensitive resin film and the light-absorbing layer are patterned at one time by photolithography.

20 Claims, 6 Drawing Sheets

COMPARATIVE
EXAMPLE

COMPARATIVE
EXAMPLE

COMPARATIVE
EXAMPLE

COMPARATIVE
EXAMPLE

COMPARATIVE
EXAMPLE

METHOD FOR FORMING PATTERN HAVING HOLLOW STRUCTURE

BACKGROUND OF THE INVENTION

Field of the Invention

The present disclosure relates to at least one method for forming a pattern having a hollow structure.

Description of the Related Art

In the field of advanced devices such as semiconductor devices and microreactors, hollow structures functioning as circuits and microchannels are often formed by photolithography. In a typical manufacturing process of a hollow structure, a first micropattern having a hollow structure is first formed on a substrate, and then a second micropattern is formed on the first micropattern. In this process, when the second micropattern is exposed to light, the light may pass through the resist film for forming the second micropattern and reflect diffusely at the relief portion, or uneven portion, of the first micropattern.

The diffused reflection at the relief portion of the first micropattern causes the diffusely reflected light to irradiate a portion of the resist film that should not be exposed, thereby undesirably reducing the line width of the second micropattern. Particularly when the first micropattern includes electrodes or conductive lines, which are often made of aluminum or any other light reflective material, the amount of light reflecting from the relief portion of the micropattern is increased, and accordingly, the line width of the second micropattern tends to be reduced.

Japanese Patent Laid-Open No. 2008-229947 discloses a method for suppressing diffused reflection from the layer underlying the first micropattern. In this method, a light-absorbing layer capable of absorbing light is formed on the surface of the underlying layer, and then a resist layer is formed on the light-absorbing layer. According to this method, even if exposure light has passed through the resist layer, the light-absorbing layer absorbs the passed light, thus reducing diffused reflection from the layer under the resist layer.

SUMMARY OF THE INVENTION

According to an aspect of the present disclosure, a method for forming a pattern having a hollow structure is provided. The method includes forming a light-absorbing layer capable of absorbing light on a surface of a photosensitive resin film; bonding a substrate having a protrusion and the photosensitive resin film together so that the protrusion and the light-absorbing layer come into contact with each other; and patterning the photosensitive resin film and the light-absorbing layer at one time by photolithography.

According to other aspects of the present disclosure, one or more additional methods for forming a pattern having a hollow structure are discussed herein. Further features of the present inventions will become apparent from the following description of exemplary embodiments with reference to the attached drawings.

DESCRIPTION OF THE EMBODIMENTS

Figure 1:
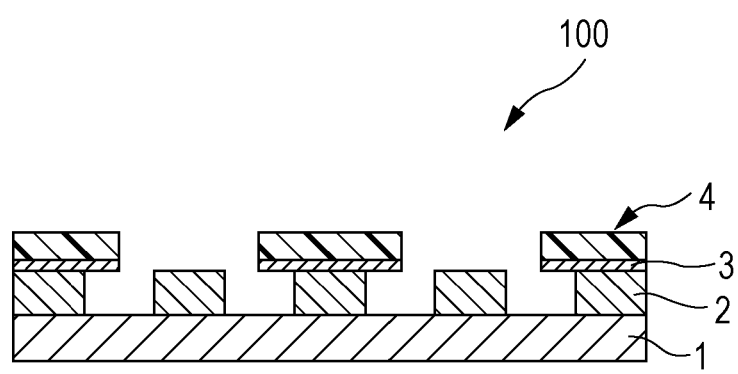
FIG. 1 is a schematic sectional view of a device having a hollow structure according to an embodiment of the present disclosure.

In the method disclosed in the above-cited Japanese Patent Laid-Open No. 2008-229947, the light-absorbing layer is formed over the entire surface of an underlying layer, and therefore will be exposed in the regions where the resist layer is removed by patterning. Since the exposed portions of the light-absorbing layer have the properties of the light-absorbing layer, the resulting device cannot exhibit desired properties. In a semiconductor device, for example, an electrical property of the light-absorbing layer causes current leakage, insulation or any other problem. In a microreactor, the light-absorbing layer remaining in a flow channel may be mixed into a reaction liquid.

Accordingly, the present disclosure provides a method for forming a pattern having a hollow structure that can reduce the exposure of the light-absorbing layer.

Embodiments and Examples of the disclosure will now be described in detail with reference to the drawings. In the following description, some of the parts having the same function are designated by the same reference numerals in the drawings, and thus description thereof is omitted.

FIG. 1 is a schematic sectional view of a device having a hollow structure according to an embodiment of the present disclosure. The device 100 shown in FIG. 1 includes a micropattern having a hollow structure. More specifically, protrusions 2 are disposed on a substrate 1, and a light-absorbing layer 3 is disposed over the surfaces of the protrusions 2. A micropattern 4 is disposed on the light absorbing layer 3.

FIGS. 2A to 2F are representations illustrating a method for manufacturing the device shown in FIG. 1. An exemplary method for manufacturing the device shown in FIG. 1 will now be described with reference to FIGS. 2A to 2F in the order of the following (A) to (E): (A) forming the protrusions 2 on the substrate 1; (B) forming a photosensitive dry film; (C) forming a light absorbing layer 3 on the photosensitive dry film; (D) bonding the substrate 1 and the photosensitive dry film together; and (E) forming a micropattern 4.

(A) Forming Protrusions 2 on a Substrate 1

Figure 2A:
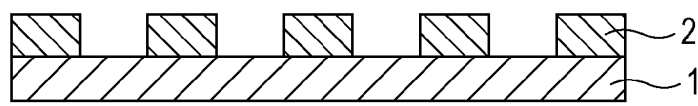
FIGS. 2A to 2F are representations illustrating a method for manufacturing a device having a hollow structure according to an embodiment of the present disclosure.

In this step, protrusions 2 are formed on a substrate 1, as shown in FIG. 2A, using protrusion members for defining hollows.

The materials of the substrate 1 and protrusion members 2 and the properties of the materials, and the process for forming a relief pattern defined by the protrusions 2 and the shape of the pattern are appropriately selected without particular limitation as long as the substrate 1 and the protrusions 2 are suitable for the desired application. For example, the protrusion members may be formed of a light-reflective metal, such as aluminum or tungsten, which are used in conductive lines and electrodes.

Figure 3:
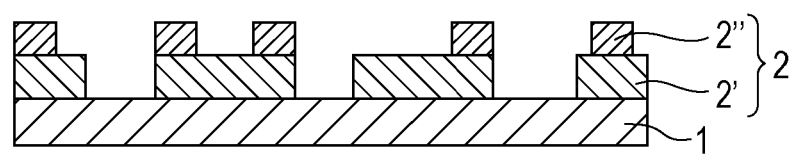
FIG. 3 is a schematic sectional view of protrusions formed in a method according to an embodiment of the present disclosure.

Each protrusion 2 may include a plurality of layers. FIG. 3 is a sectional view showing multilayer protrusions 2. In an embodiment shown in FIG. 3, the protrusions 2 each include two layers 2' and 2". These layers may be made of the same material or different materials.

Figure 4:
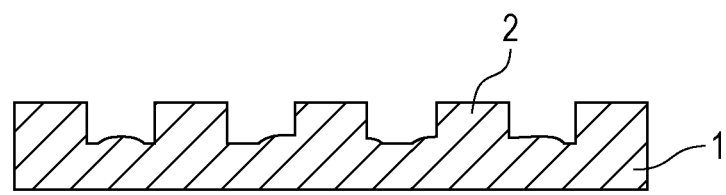
FIG. 4 is a schematic sectional view of protrusions in another form formed in a method according to an embodiment of the present disclosure.

Alternatively, the protrusions 2 may be formed in the substrate 1 by working the substrate 1, as shown in FIG. 4, instead of using the protrusion members for defining hollows. In this instance, a fine relief pattern including such protrusions 2 may be formed in the substrate 1 by etching, such as sandblasting.

(B) Forming a Photosensitive Dry Film

Figure 2B:
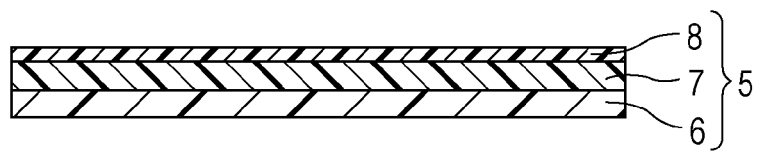

In this step, a photosensitive dry film 5 is formed apart from the substrate 1, as shown in FIG. 2B.

The photosensitive dry film 5 shown in FIG. 2B has a multilayer structure including a base film 6, a photosensitive resin film 7, and a cover film 8 that are formed in that order.

Advantageously, the base film 6 is formed of a smooth, transparent and handleable material. Such materials for the base film 6 include polyester, polyethylene terephthalate and polycarbonate. These materials may be used single or in combination.

The photosensitive resin film 7 is formed of a resist material that will be cured by being irradiated with light. Although the resist material of the photosensitive resin film 7 may be a material that will be cured by being irradiated with visible light, a photo-cationic polymerizable resin composition that will be being cured by irradiation with UV light is advantageous from the viewpoint of preventing curing by indoor lighting. If the device 100 is a micro-device such as a semiconductor device, the photosensitive resin film 7 must be thin. Accordingly, the resist material is desirably a resin having some mechanical strength even if it is formed into a thin film. It is therefore advantageous that the photo-cationic polymerizable resin composition contains an epoxy resin exhibiting high mechanical strength and strong adhesion to the underlying base film.

The epoxy resin may be bisphenol A. Other epoxy resins may be used, and examples thereof include novolak epoxy resin, a resin product named SU-8 available from Kayaku MicroChem, and a resin product named EHPE-3150 available from Daicel. The epoxy resin desirably has an epoxy equivalent weight of 2000 or less, such as 1000 or less. Epoxy resin having an epoxy equivalent weight of 2000 or less helps prevent the decrease of the crosslink density of the photo-cationic polymerizable resin composition when it is cured, and also helps prevent the decrease of the glass transition temperature and adhesion of the photo-cationic polymerizable resin composition.

Advantageously, the photo-cationic polymerizable resin composition contains an epoxy resin and a photo-cationic polymerization initiator that helps cure the epoxy resin. The photo-cationic polymerization initiator may be an aromatic iodonium salt or an aromatic sulfonium salt. A plurality of photo-cationic polymerization initiators may be used in combination. Examples of the aromatic iodonium salt include those named DPI-105, MPI-103 and -105 available from Midori Kagaku. Examples of the aromatic sulfonium salt include those named ADEKA Optomers SP-170 and SP-172 available from ADEKA. The photo-cationic polymerization initiator may be used in combination with a reducing agent, or may be heated to accelerate cationic polymerization. The reducing agent may be copper triflate from the viewpoint of reactivity and solubility in the epoxy resin.

The cover film 8 prevents the photosensitive resin film from being scratched or getting dirty. The cover film 8 may be formed of any material without particular limitation as long as it can be easily removed from the photosensitive resin film 7. For example, the cover film 8 may be a versatile polyethylene film.

Figure 5:
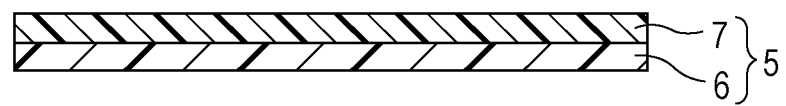
FIG. 5 is a schematic sectional view of a photosensitive dry film according to an embodiment of the present disclosure.

The photosensitive dry film 5 may be in the structure as shown in FIG. 5, or the structure shown in FIG. 2B from which the cover film 8 has been taken away.

A process for forming the photosensitive dry film 5 will now be described.

First, a photo-cationic polymerizable resin, a photo-cationic polymerization initiator and a reducing agent are dissolved in a solvent to prepare a photo-cationic polymerizable resin composition for forming the photosensitive resin film 7. The solvent is not particularly limited, as long as it can dissolve the photo-cationic polymerizable resin, the photo-cationic polymerization initiator and the reducing agent and allows the photo-cationic polymerizable resin composition to be uniformly applied. Examples of the solvent include poly (methyl isopropenyl ketone), propylene glycol monomethyl ether, methyl lactate, cyclohexanone, methyl isobutyl ketone and ethanol. These solvents may be used single or in combination.

The photosensitive dry film 5 is formed using the photo-cationic polymerizable resin composition. More specifically, first, the photo-cationic polymerizable resin composition is uniformly applied onto a base film 6, and then the solvent is evaporated from the coating film to yield the photosensitive resin film 7. Subsequently, a cover film 8 is laminated to the photosensitive resin film 7.

The photo-cationic polymerizable resin composition may be applied by any known versatile technique, such as melt extrusion, solution casting, or calendering, without particular limitation, as long as the resin composition can be uniformly applied. The lamination of the cover film 8 may be performed by any technique, as long as the cover film 8 can be uniformly laminated and the laminated cover film 8 can be completely removed from the photosensitive resin film 7. For example, the cover film 8 may be laminated by a known technique, such as vacuum lamination, extrusion lamination, or adhesive lamination.

(C) Forming a Light-Absorbing Layer 3 on the Photosensitive Dry Film

Figure 2C:
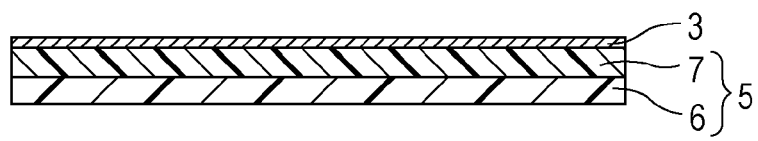

In this step, a light-absorbing layer 3 is formed on the photosensitive dry film 5, as shown in FIG. 2C.

The light-absorbing layer 3 contains a light absorbent capable of absorbing light having wavelengths in the same range as light to which the photosensitive resin film 7 is exposed. The light absorbent is not otherwise limited. Since a photo-cationic polymerizable resin composition that will be being cured by irradiation with UV light is advantageously used as the resist material of the photosensitive resin film 7, the light absorbent is desirably a material that can absorb light having wavelengths of 400 nm or less, which are lower than or equal to the wavelengths of visible light.

The examples of the light absorbent include benzophenone-based or cyanoacrylate-based organic UV absorbents. Benzophenone-based UV absorbents include 2,3',3,4'-tetrahydroxybenzophenone, 2-hydroxy-4-methoxybenzophenone, and 2,4-dihydroxybenzophenone. Other benzophenone-based UV absorbents may be used, such as 2,3,4-trihydroxybenzophenone, 2,3,4,4'-tetrahydroxybenzophenone, 2-hydroxy-4-octoxybenzophenone, and 3-aminobenzophenone.

Cyanoacrylate-based UV absorbents include methyl 2-cyano-3-methyl-3-(p-methoxyphenyl)acrylate and butyl 2-cyano-3-methyl-3-(p-methoxyphenyl)acrylate. Other cyanoacrylate-based UV absorbents may be used, such as ethyl 2-cyano-3,3'-diphenylacrylate. These UV absorbents may be used singly or in combination.

A process for forming the light-absorbing layer 3 on the photosensitive dry film 5 will now be described in detail.

First, a light absorbent is dissolved in a solvent to prepare a coating solution for forming the light-absorbing layer 3. This solvent may be an alcohol-based solvent, such as ethanol. For the light absorbent content in the coating solution, if 2,3',3,4'-tetrahydroxybenzophenone is used as the light absorbent and dissolved in ethanol, the content may be 0.5% to 5% by mass. When the coating solution contains 0.5% by mass or more of the light absorbent, the micropattern 4 can be prevented more reliably from being deformed. Also, the light absorbent content is desirably 5% by mass or less from the viewpoint of allowing for the precipitation of the light absorbent. The light absorbent content in the coating solution however depends on the types of the light absorbent and solvent, and the range of the light absorbent content shown above is merely an example.

Then, the coating solution is applied onto the surface of the photosensitive dry film 5 to form the light-absorbing layer 3. More specifically, first, the coating solution is uniformly applied onto the photosensitive resin film 7, and then the solvent is evaporated from the coating film by heating to yield the light-absorbing layer 3. The application apparatus for applying the coating solution is not particularly limited as long as the light-absorbing layer 3 can be uniformly formed, and general-purpose apparatuses can be used such as spin coater, die coater, slit coater and spray coater.

The thickness of the light-absorbing layer 3 may be adjusted according to the concentration of the light absorbent. In the present embodiment, the thickness of the light-absorbing layer 3 is desirably 1 μm or more, from the viewpoint of reliably preventing the micropattern 4 from being deformed. In addition, such a thickness of the light-absorbing layer 3 formed on the photosensitive dry film 5 enables the light absorbent to be retained on the surface of the photosensitive resin film 7, thus preventing light from reaching the lowermost layer without attenuating in the photosensitive resin film 7. This prevents the line width of the micropattern 4 from being reduced in the thickness direction.

For obtaining these advantageous effects, the methods and materials for forming the photosensitive resin film 7 and the light-absorbing layer 3 can be appropriately selected.

For example, the light-absorbing layer 3 may be formed of a resin composition containing the light absorbent and a resin. Such a resin composition allows the light absorbent to be retained on the surface of the photosensitive resin film 7.

Figure 6:
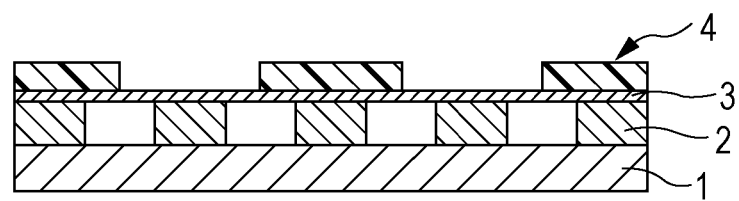
FIG. 6 is a conceptual diagram illustrating a defective pattern.

The resin to be added to the light absorbent desirably can be dissolved in the developer used in the step of forming the micropattern 4 together with the light absorbent, from the viewpoint of preventing a defect as shown in FIG. 6 in which a portion of the light-absorbing layer 3 remains after the formation of the micropattern 4. For example, the resin may be the same as the resin used in the photosensitive resin film 7 of the photosensitive dry film 5.

The light absorbent can be retained on the photosensitive resin film 7 by appropriately selecting the solvent of the coating solution containing the light absorbent or the material of the photosensitive resin film 7 of the photosensitive dry film 5.

For example, a case will be discussed in which 2,3',3,4'-tertahydroxybenzophenone is used as the light absorbent and the photosensitive resin film contains an epoxy resin SU-8. In this case, an alcohol-based solvent, such as ethanol or isopropyl alcohol, may be used as the solvent in the coating solution containing the light absorbent. These solvents do not dissolve the photosensitive dry film 5 more than required, and allow the light absorbent to be retained on the surface of the photosensitive dry film 5. The solvent in the coating solution containing the light absorbent may be composed of a single constituent or two or more constituents.

(D) Bonding the Photosensitive Dry Film to the Substrate 1

Figure 2D:
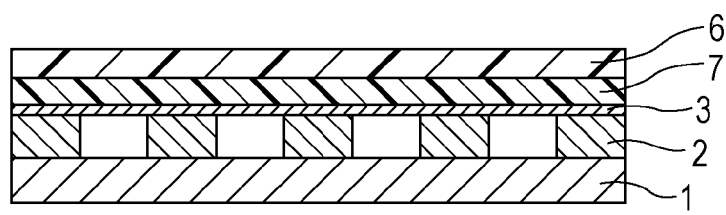

In this step, the substrate 1 and the photosensitive dry film 5 are bonded together in such a manner that the protrusions 2 on the substrate 1 come into contact with the light-absorbing layer 3 on the photosensitive dry film 5, as shown in FIG. 2D.

More specifically, the substrate 1 and the photosensitive dry film 5 are disposed on each other in such a manner that the protrusions 2 and the light-absorbing layer 3 come into contact with each other, and are bonded together with a laminator to form a lamination of the photosensitive dry film disposed on the substrate 1. The lamination method for bonding the substrate 1 and the photosensitive dry film 5 together is not particularly limited as long as development residues are not left after the development of the micropattern 4 as will be described later. For the lamination, thermal lamination, extrusion lamination, or adhesive lamination may be performed.

(E) Forming a Micropattern 4

Figure 2E:
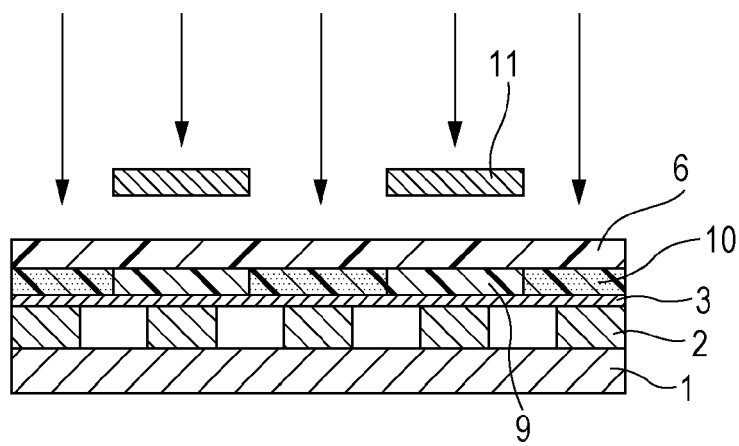
Figure 2F:
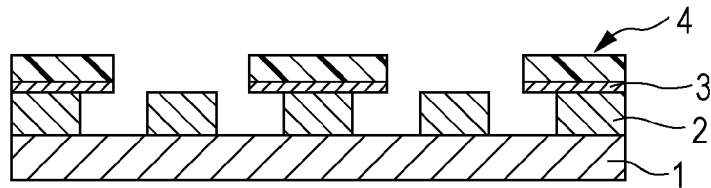

In this step, the photosensitive resin film 7 and the light-absorbing layer on the substrate 1 are simultaneously patterned into a micropattern 4 by photolithography, as shown in FIGS. 2E and 2F.

More specifically, first, the pattern of a photomask 11 is adjusted so that the portions 10 of the photosensitive resin film 7 intended as the lines of the micropattern 4 can be exposed to light, as shown in FIG. 2E, and the photosensitive resin film 7 is exposed to light through the photomask 11. In this operation, light having a wavelength at which the photosensitive resin film 7 can be sensitized is used for exposure.

In this operation, the light-absorbing layer 3 absorbs light transmitted through the photosensitive resin film 7, thus preventing the exposure of the portions 9 of the photosensitive resin film 7 that should not be exposed to light (hereinafter referred to as unexposed portions). The removal of the base film 6 may be performed either before or after the exposure, if it is made of a highly transparent material. Also, heat treatment may be performed to promote the curing reaction of the resin in the portions 10 exposed to light.

Subsequently, the unexposed portions 9 of the photosensitive resin film 7 and the portions of the light-absorbing layer 3 underlying the unexposed portions 9 are simultaneously developed and removed to form the micropattern 4, as shown in FIG. 2F. The developer is not particularly limited as long as it can dissolve the unexposed portions 9 of the photosensitive resin film 7 and the light-absorbing layer 3 underlying the unexposed portions 9. For example, a case will be discussed in which 2,3',3,4'-tertahydroxybenzophenone is used as the light absorbent and the photosensitive resin film 7 contains an epoxy resin EHPE-3150. Examples of the developer include propylene glycol monomethyl ether, methyl isobutyl ketone and ethanol.

In order to enhance the durability of the micropattern 4, the photosensitive resin film 7 is subjected to curing treatment by light exposure or heating so that the unreacted portion of the photosensitive resin film 7 can be completely cured.

EXAMPLES

The present disclosure will be further described with reference to Examples and Comparative Examples. The following are merely examples of the inventions, and the inventions are not limited to the following Examples. Properties in patterning the micropattern 4 were examined in the Examples and Comparative Examples and the results are shown together in Table 4.

Properties in Patterning

For examining properties in patterning, samples were observed for the presence or absence of the residue of the light-absorbing layer 3 at the unexposed portions 9 on the substrate 1 and the shape (in plan view and in section) of the micropattern 4 formed in the photosensitive resin film 7. The results were rated as the following three: good, fair and bad. The observations for the presence or absence of the residue of the light-absorbing layer 3 and the shape of the micropattern 4 were performed with a scanning electron micrograph (S-4300 manufactured by Hitachi High-Technologies).

Presence or Absence of the Residue of the Light-Absorbing Layer 3

Good: No residue was observed.
Fair: A residue as small as 0.3 µm or less was observed.
Bad: A residue as large as 0.3 µm or more was observed.

Shape of the Micropattern 4

Good: The line width of the line/space pattern was 20 µm and the lines of the pattern were straight.
Fair: The line width of the line/space pattern was 18 µm to 19 µm or 21 µm to 22 µm, and the lines of the pattern were straight.
Bad: The line width of the line/space pattern was as large as more than 18 µm or more than 22 µm, and the lines of the pattern were not straight and were overhanging.

Example 1

(A) Forming Protrusions 2 on a Substrate 1

For forming protrusions 2 on a substrate 1 using protrusion member for defining hollows, a resist pattern was formed on the substrate 1 by photolithography.

Figure 7A:
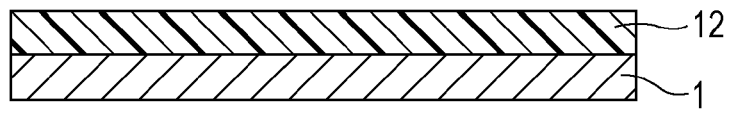
FIGS. 7A to 7D are representations illustrating a method for forming protrusions according to an embodiment of the present disclosure.

More specifically, first, the photo-cationic polymerizable resin composition shown in Table 1 was applied to a thickness of 25 µm onto a Si substrate 1, and then heated at 60° C. for 9 minutes to yield a resin layer 12 that is a negative photosensitive resin layer (FIG. 7A).

Subsequently, the resin layer 12 was exposed to light with an irradiation energy of 350 mJ/cm$^2$ through a photomask, using an i-ray exposure stepper (manufactured by Canon). This exposure was performed so that a pattern of line/space=10 µm/10 µm could be formed. After the exposure, the sample was subjected to heat treatment at 90° C. for 4 minutes. Furthermore, the resin layer 12 was developed with xylene/MIBK=6/4 to form protrusions 2.

Finally, the sample was further heated at 200° C. for 1 hour so as to completely cure the photo-cationic polymerizable resin in the protrusions 2. Thus, the substrate 1 having the protrusions 2 was completed (FIG. 2A).

(B, C) Forming a Photosensitive Dry Film 5 and Forming a Light-Absorbing Layer 3 on the Photosensitive Dry Film 5

The photo-cationic polymerizable resin composition shown in Table 1 was spread over the surface of a PET film FB50 Lumirror (manufactured by Toray), which is the base film 6, so as to form a 20 µm thick coating film by solution casting. After drying the coating film by heating at 90° C. for 5 minutes, the base film 6 was taken up. Then, a PET film Purex A31 (manufactured by Teijin DuPont Film) was disposed as the cover film 8, and the sample was heated at 50° C. for 1 minute (FIG. 2B).

Subsequently, the cover film 8 was removed from the photosensitive resin film 7. Then, a solution of 1% by mass of 2,3',3,4'-tertahydroxybenzophenone as the light absorbent in polyethylene glycol monomethyl ether was applied onto the photosensitive dry film 5 by spin coating. Then, the sample was heated at 90° C. for 3 minutes to yield a light-absorbing layer 3 on the surface of the photosensitive dry film 5 (FIG. 2C).

(C, D) Bonding the Photosensitive Dry Film 5 to the Substrate 1 and Forming a Micropattern 4

First, the photosensitive dry film 5 was disposed on the substrate 1 in such a manner that the protrusions 2 and the light-absorbing layer 3 would come into contact with each other, and then the sample was heated at 90° C. for 4 minutes to bond the photosensitive dry film 5 to the substrate 1 (FIG. 2D).

Subsequently, the photosensitive dry film 5 was exposed to light with an irradiation energy of 350 mJ/cm$^2$ through a photomask 11, using an i-ray exposure stepper manufactured by Canon (FIG. 2E). This exposure was performed so that a pattern of line/space=20 µm/20 µm could be formed. After the exposure, the base film 6 was removed from the photosensitive dry film 5, and the sample was further subjected to heat treatment at 90° C. for 4 minutes.

Then, the photosensitive resin film 7 exposed by removing the base film 6 was developed with xylene/MIBK=6/4 to form a micropattern 4.

Finally, the sample was further heated at 200° C. for 1 hour so as to completely cure the photo-cationic polymerizable resin in the micropattern 4. Thus, the micropattern 4 having a hollow structure was completed (FIG. 2F).

Evaluation Results

As shown in Table 4, Example 1 produced a satisfactory pattern that hardly exhibited a residue of the light-absorbing

TABLE 1

| Epoxy resin | EHPE-3150, Daicel | 100 parts by mass |
|---|---|---|
| Photo-cationic polymerization initiator | SP-172, ADEKA | 6 part by mass |
| Silane coupling agent | A-187, Momentive Performance Materials | 5 parts by mass |
| Solvent | Hysorb EDM, TOHO Chemical Industry | 70 parts by mass | layer 3 left by development, and had a good shape even though the line width was slightly reduced in the depth direction.

Example 2

(A) Forming Protrusions 2 in a Substrate 1

For forming protrusion 2 in a substrate 1, a resist pattern was formed, and then the substrate 1 was etched using the resist pattern as a mask.

More specifically, first, the positive photosensitive resin composition shown in Table 2 was applied to a thickness of 5 μm onto a Si substrate 1, and then heated at 95° C. for 2 minutes to yield a resin layer 12 that is a positive photosensitive resin layer (FIG. 7A).

TABLE 2

| m,p-Cresol novolak resin | EP4020G, Asahi Organic Chemicals Industry | 100 parts by mass |
|---|---|---|
| Photo-cationic polymerization initiator | PAI-101, Midori Kagaku | 1 part by mass |
| Solvent | Hysorb EDM, TOHO Chemical Industry | 100 parts by mass |

Figure 7B:
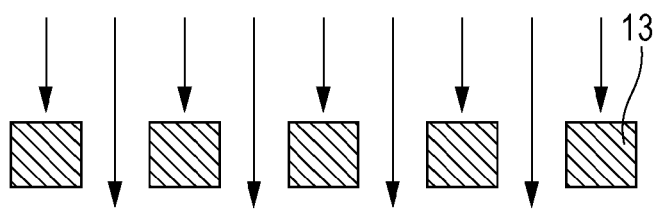
Figure 7C:
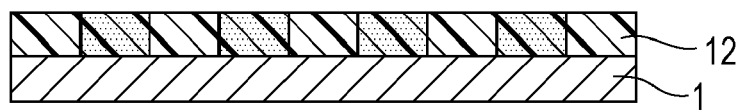

Subsequently, the resin layer 12 was exposed to light with an irradiation energy of 500 mJ/cm$^2$ through a photomask 13, using a PLA-501 exposure device (ultrahigh-pressure mercury-vapor lamp, manufactured by Canon). This exposure was performed so that a pattern of line/space=10 μm/10 μm could be formed (FIG. 7B). After being exposed to light, the resin layer 12 was developed at 23° C. for 60 seconds with an alkaline developer (solution of 0.4% by mass of tetramethylammonium hydroxide in water), and rinsed with ultrapure water for 20 seconds to yield a resist photomask (FIG. 7C).

Figure 7D:
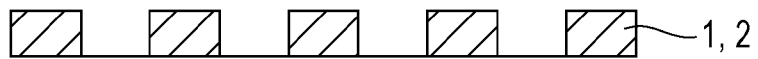
Figure 8A:
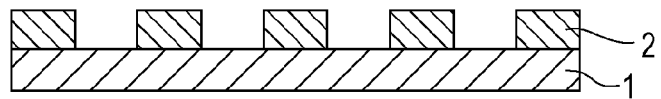
FIGS. 8A to 8E are representations illustrating a method for manufacturing a device having a hollow structure, applied to a comparative example.
Figure 8B:
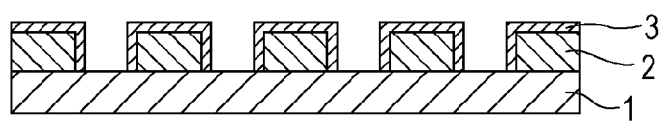
Figure 8C:
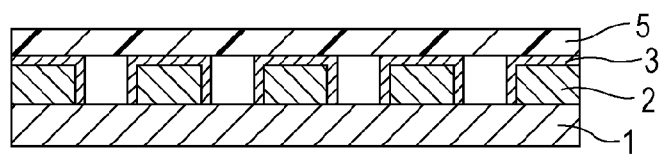
Figure 8D:
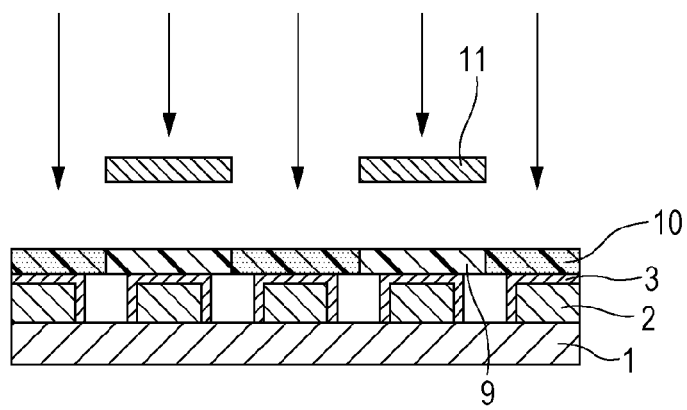
Figure 8E:
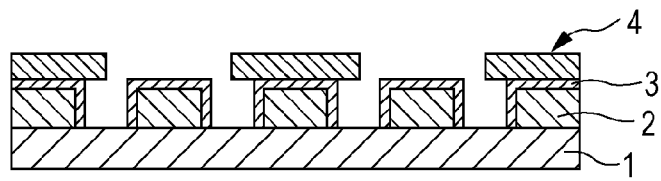

Then, the substrate 1 was subjected to wet etching, using HI-F as etchant. Then, the substrate 1 was immersed in a resist removal solution that is a solution of 5% by mass of tetramethylammonium hydroxide in water (pH>13.7) for 2 minutes and was subsequently rinsed with water to yield a substrate 1 having protrusions 2 (FIG. 7D).

Other steps were performed in the same manner as in Example 1.
Evaluation Results As shown in Table 4, Example 2 produced a satisfactory pattern that hardly exhibited a residue of the light-absorbing layer 3 left by development, and had a good shape even though the line width was slightly reduced in the depth direction.

Example 3

(A) Forming Protrusions 2 in a Substrate 1

For forming protrusion 2 in a substrate 1 by working the substrate 1, a resist pattern was formed on the substrate 1, and then the substrate 1 was subjected to sandblasting using the resist pattern as a mask.

More specifically, first, the photosensitive resin composition shown in Table 2 was applied to a thickness of 5 μm onto a Si substrate 1, and then heated at 95° C. for 2 minutes to yield a resin layer 12 (FIG. 7A).

Subsequently, the resin layer 12 was exposed to light with an irradiation energy of 500 mJ/cm$^2$ through a photomask 13, using a PLA-501 exposure device (ultrahigh-pressure mercury-vapor lamp, manufactured by Canon). This exposure was performed so that a pattern of line/space=10 μm/10 μm could be formed (FIG. 7B). After being exposed to light, the photosensitive resin composition layer was developed at 23° C. for 60 seconds with an alkaline developer (solution of 0.4% by mass of tetramethylammonium hydroxide in water), and rinsed with ultrapure water for 20 seconds to yield a resist photomask (FIG. 7C).

After patterning, the substrate 1 was placed on a work table in a sandblasting apparatus. Then, the substrate 1 was subjected to sandblasting through the resist photomask so as to form recesses in the portions of the surface of the substrate 1 exposed in the openings of the resist photomask. Thus a substrate 1 having protrusions 2 was formed (FIG. 4). For sandblasting, in this Example, White Alundum (alumina oxide) was used as beads.

Other steps were performed in the same manner as in Example 1.
Evaluation Results As shown in Table 4, Example 3 produced a satisfactory pattern that hardly exhibited a residue of the light-absorbing layer 3 left by development, and had a good shape even though the line width was slightly reduced in the depth direction.

Example 4

(C) Forming a Light-Absorbing Layer 3 on a Photosensitive Dry Film 5

In Example 4, a solution of 1% by mass of methyl 2-cyano-3-methyl-3-(p-methoxyphenyl)acrylate as the light absorbent in polyethylene glycol monomethyl ether was applied onto a photosensitive dry film 5 by spin coating. Other steps were performed in the same manner as in Example 1.
Evaluation Results As shown in Table 4, Example 4 produced a satisfactory pattern that hardly exhibited a residue of the light-absorbing layer 3 left by development, and had a good shape even though the line width was slightly reduced in the depth direction.

Example 5

(C) Forming a Light-Absorbing Layer 3 on a Photosensitive Dry Film 5

In Example 5, a solution containing 1% by mass of 2,3',3,4'-tetrahydroxybenzophenone as the light absorbent and 20% by mass of EHPE-3150 in polyethylene glycol monomethyl ether was applied onto a photosensitive dry film 5 by spin coating.

Other steps were performed in the same manner as in Example 1.
Evaluation Results As shown in Table 4, Example 5 produced a satisfactory pattern that did not exhibit a residue of the light-absorbing layer 3 left by development.

Example 6

(C) Forming a Light-Absorbing Layer 3 on a Photosensitive Dry Film 5

In Example 6, for forming a light-absorbing layer 3, first, the photo-cationic polymerizable resin composition shown in Table 3 was spread over the surface of a PET film FB50 Lumirror (manufactured by Toray) that is the base film 6 so as to form a 20 μm thick coating film by solution casting. After the coating film was dried by heating at 90° C. for 5 minutes, the base film 6 was taken up. Then, a PET film Purex A31 (manufactured by Teijin DuPont Film) was disposed as the cover film 8, and the sample was heated at 50° C. for 1 minute.

Table 3
Photo-cationic polymerizable resin composition SU-8, Kayaku MicroChem 100 parts by mass Subsequently, the cover film 8 was removed from the photosensitive resin film 7, and a solution of 1% by mass of 2,3',3,4'-tertahydroxybenzophenone as the light absorbent in ethanol was applied onto the photosensitive dry film 5 by spin coating.

Other steps were performed in the same manner as in Example 1.

Evaluation Results

As shown in Table 4, Example 6 produced a satisfactory pattern that hardly exhibited a residue of the light-absorbing layer 3 left by development.

Comparative Example 1

A device was produced in the same manner as in Example 1, except that the light-absorbing layer 3 was not formed.

Evaluation Results

As shown in Table 4, the pattern produced in Comparative Example 1 exhibited poor reproducibility of the exposure photomask and was thus unsatisfactory, while a residue of the light-absorbing layer 3 was not left because the light-absorbing layer was not formed.

Comparative Example 2

A light-absorbing layer 3 was formed over a substrate 1 having protrusions 2, but not on a photosensitive dry film 5 (FIGS. 8A to 8E). Other steps were performed in the same manner as in Example 1.

Evaluation Results

As shown in Table 4, Example 2 produced a micropattern of the light-absorbing layer 3 that was good in shape, but exhibited a significant residue of the light-absorbing layer 3.

TABLE 4

| | | | Coating solution containing light absorbent | | | Position of light-absorbing layer | Evaluation | |
|---|---|---|---|---|---|---|---|---|
| | Substrate | Protrusion member | Light absorbent | Resin | Solvent | On photosensitive resin film | Residue after Development | Pattern shape |
| Example 1 | Si substrate | Photo-cationic polymerizable resin | 2,3',3,4'-Tetrahydroxybenzophenone | None | Polyethylene glycol monomethyl ether | On photosensitive resin film | Fair | Fair |
| Example 2 | Si substrate | Si substrate (worked by wet etching) | 2,3',3,4'-Tetrahydroxybenzophenone | None | Polyethylene glycol monomethyl ether | On photosensitive resin film | Fair | Fair |
| Example 3 | Si substrate | Si substrate worked by sandblasting | 2,3',3,4'-Tetrahydroxybenzophenone | None | Polyethylene glycol monomethyl ether | On photosensitive resin film | Fair | Fair |
| Example 4 | Si substrate | Photo-cationic polymerizable resin | Methyl 2-cyano-3-methyl-3-(p-methoxyphenyl) acrylate | None | Polyethylene glycol monomethyl ether | On photosensitive resin film | Fair | Fair |
| Example 5 | Si substrate | Photo-cationic polymerizable resin | 2,3',3,4'-Tetrahydroxybenzophenone | EHPE-3150 | Polyethylene glycol monomethyl ether | On photosensitive resin film | Good | Good |
| Example 6 | Si substrate | Photo-cationic polymerizable resin | 2,3',3,4'-Tetrahydroxybenzophenone | None | Ethanol | On photosensitive resin film | Fair | Good |
| Comparative Example 1 | Si substrate | Photo-cationic polymerizable resin | None | None | None | None | Good | Bad |
| Comparative Example 2 | Si substrate | Photo-cationic polymerizable resin | 2,3',3,4'-Tetrahydroxybenzophenone | None | Polyethylene glycol monomethyl ether | On Si substrate | Bad | Fair |

The figures and description in the above embodiments and Examples are merely intended to help understand the inventions, and the inventions are not limited to those.

While the present inventions have been described with reference to exemplary embodiments, it is to be understood that the inventions are not limited to the disclosed exemplary embodiments. The scope of the following claims is to be accorded the broadest interpretation so as to encompass all such modifications and equivalent structures and functions.

This application claims the benefit of Japanese Patent Application No. 2014-169145, filed Aug. 22, 2014, which is hereby incorporated by reference herein in its entirety.

What is claimed is:

1. A method for forming a pattern having a hollow structure, the method comprising:
   forming a light-absorbing layer capable of absorbing light on a surface of a photosensitive resin film;
   bonding a substrate having a protrusion and the photosensitive resin film together so that the protrusion and the light-absorbing layer come into contact with each other; and
   patterning the photosensitive resin film and the light-absorbing layer at one time by photolithography,
   wherein the light absorbent is one or more selected from a group consisting of 2,3',3,4'-tetrahydroxybenzophenone, 2-hydroxy-4-methoxybenzophenone, 2,4-dihydroxybenzophenone, 2,3,4-trihydroxybenzophenone, 2,3,4,4'-tetrahydroxybenzophenone, 2-hydroxy-4-octoxybenzophenone, 3-aminobenzophenone, methyl 2-cyano-3-methyl-3-(p-methoxyphenyl)acrylate butyl 2-cyano-3-methyl-3-(p-methoxyphenyl)acrylate, and ethyl 2-cyano-3,3'-diphenylacrylate.

2. The method according to claim 1, wherein the patterning includes: exposing a portion of the photosensitive resin film to light through a photomask to cure the exposed portion of the photosensitive resin film; and developing an unexposed portion of the photosensitive resin film and a portion of the light-absorbing layer under the unexposed portion at one time.

3. The method according to claim 2, wherein the protrusion comprises a plurality of protrusions being spaced apart from each other on or in the substrate such that the plurality of protrusions define hollows between each protrusion, the hollows defining the hallow structure; and
   wherein the developing step further includes removing the portion of the light-absorbing layer and the unexposed portion of the photosensitive resin film from one or more protrusions of the plurality of protrusions such that at least one or more other protrusions retain respective other portions of the light-absorbing layer and respective exposed, patterned portion of the photosensitive resin film thereon to form the pattern having the hallow structure.

4. The method according to claim 1, wherein the photosensitive resin film contains a photo-cationic polymerizable resin.

5. The method according to claim 1, wherein the light-absorbing layer contains a light absorbent capable of absorbing light having wavelengths in a same range as light emitted for exposure in the patterning.

6. The method according to claim 5, wherein the forming of the light-absorbing layer is performed by applying a solution containing the light absorbent and a photo-cationic polymerizable resin onto the surface of the photosensitive resin film.

7. The method according to claim 6, wherein a content of the absorbent in the solution is 0.5% to 5% by mass.

8. The method according to claim 5, wherein the forming of the light-absorbing layer is performed by applying a solution containing the light absorbent and a same resin as a resin contained in the photosensitive resin film onto the surface of the photosensitive resin film.

9. The method according to claim 5, wherein the forming of the light-absorbing layer is performed by applying a solution of the light absorbent in an alcohol-based solvent to the surface of the photosensitive resin film.

10. The method according to claim 1, wherein the protrusion and the light-absorbing layer directly contact each other.

11. The method according to claim 1, wherein the protrusion comprises a plurality of protrusions being spaced apart from each other on or in the substrate such that the plurality of protrusions define hollows between each protrusion.

12. The method according to claim 1, wherein the protrusion includes an electrode or a conductive line.

13. The method according to claim 1, wherein the protrusion includes an electrode or a conductive line which is formed of metal containing aluminum or tungsten.

14. The method according to claim 1, wherein the protrusion is a resist pattern formed on the substrate by photolithography.

15. The method according to claim 1, wherein the protrusion is formed in the substrate by etching.

16. The method according to claim 1, wherein the protrusion includes a plurality of layers.

17. The method according to claim 1, wherein the light absorbent is one or more selected from a group consisting of 2,3',3,4'-tetrahydroxybenzophenone, 2-hydroxy-4-methoxybenzophenone, and 2,4-dihydroxybenzophenone.

18. The method according to claim 1, wherein a thickness of the light-absorbing layer is 1 μm or more.

19. A method for forming a pattern having a hollow structure, the method comprising:
   forming a light-absorbing layer capable of absorbing light on a surface of a photosensitive resin film;
   bonding a substrate having a protrusion and the photosensitive resin film together so that the protrusion and the light-absorbing layer come into contact with each other; and
   patterning the photosensitive resin film and the light-absorbing layer at one time by photolithography,
   wherein the light-absorbing layer contains a light absorbent capable of absorbing light having wavelengths in a same range as light emitted for exposure in the patterning,
   wherein the forming of the light-absorbing layer is performed by applying a solution containing the light absorbent and a photo-cationic polymerizable resin onto the surface of the photosensitive resin film, and
   wherein a content of the absorbent in the solution is 0.5% to 5% by mass.

20. A method for forming a pattern having a hollow structure, the method comprising:
   forming a light-absorbing layer capable of absorbing light on a surface of a photosensitive resin film;
   bonding a substrate having a protrusion and the photosensitive resin film together so that the protrusion and the light-absorbing layer come into contact with each other; and
   patterning the photosensitive resin film and the light-absorbing layer at one time by photolithography,
   wherein a thickness of the light-absorbing layer is 1 μm or more.

* * * * *